(12) United States Patent
Wördenweber (10) Patent No.: US 6,345,190 B1
(45) Date of Patent: *Feb. 5, 2002

(54) ASSEMBLY OF CARRIER AND SUPERCONDUCTIVE FILM

(75) Inventor: Roger Wördenweber, Niederzier (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/695,433

(22) Filed: Oct. 24, 2000

Related U.S. Application Data (62) Division of application No. 09/102,461, filed on Jun. 22, 1998, now Pat. No. 6,175,749.

(51) Int. Cl.⁷ .......................... H01B 12/02; H01F 6/00; H01L 39/00
(52) U.S. Cl. ...................... 505/191; 257/421; 257/662; 257/663; 505/235
(58) Field of Search .................... 257/421, 661–663; 505/191, 235

(56) References Cited

U.S. PATENT DOCUMENTS

| | | | | |
|---|---|---|---|---|
| 4,802,951 A | * | 2/1989 | Clarke et al. | 216/56 |
| 4,828,931 A | * | 5/1989 | Ogawa et al. | 505/233 |
| 5,623,160 A | * | 4/1997 | Liberkowski | 257/621 |

* cited by examiner

*Primary Examiner*—Allan R. Wilson
(74) *Attorney, Agent, or Firm*—Herbert Dubno (57) ABSTRACT

A flux-pinning system comprised of a high temperature superconductor film on a carrier wherein the film is provided with a multiplicity of holes of a radius of 50 to 2000 nm serves as the basis for an electronic component which can be utilized in high frequency and radial frequency circuits and in conjunction with SQUIDs. The holes can be arranged with variable density over the film or in the form of a uniform hexagonal or square grid and the high temperature superconductor is preferably a $YBa_2Cu_3O_7$ composition. The film has a configuration of a high frequency component and may be strip shaped or loop shaped.

11 Claims, 8 Drawing Sheets

ASSEMBLY OF CARRIER AND SUPERCONDUCTIVE FILM

CROSS REFERENCE TO RELATED APPLICATION

This application is a division of Ser. No. 09/102,461 filed Jun. 22, 1998, now U.S. Pat. No. 6,175,749.

FIELD OF THE INVENTION

The invention relates to an assembly which is comprised of a carrier and a thin film disposed on the carrier and formed from a superconductor, whereby the thin film is provided with a multiplicity of holes through the thin film with a radius in the range of 50 to 2000 nm.

BACKGROUND OF THE INVENTION

In Solid State Commun. 91, 331 (1994), Metlushko, V.V. et al describe a thin film which is comprised of a conventional type II superconductor and which is penetrated with a periodic hole grid pattern. The flux tubes which develop in the superconductive film at a sufficiently large magnetic field organize themselves in the form of a grid (Abrikosov Grid). Based upon a measurement of the direct current conductivity as a function of the strength of an external magnetic field, that article provides information as to an interchange between the Abrikosov Grid and the superimposed artificial hole grid.

In addition, for many years high temperature superconductors (HTSC) have been known. As distinct from conventional superconductors, HTSCs can operate even at the temperature of liquid nitrogen (77K) so that the cost of cooling can be drastically reduced. HTSCs, however, have the drawback that in the superconductive state, they have a high dissipation by comparison with conventional type II superconductors.

In the high frequency field, especially in the microwave range (300 MHz to 300 GHz), it is desirable to operate with walls of components such as, for example, resonators or hollow wave guides, as much as possible without losses of electrical conductivity of surface currents. For that purpose, significant HF characteristics of the corresponding components, for example, Q-factor, damping and the like, should be improved.

To reduce the ohmic losses of metal surfaces of HF components, it is already known to polish the surfaces, to plate them or to provide them with surface coatings comprised of a metal of high electrical conductivity (silver, gold).

It is also known, in addition, to improve the electrical conductivity of HF components by the use of superconductive surface layers. It is a drawback here that to maintain the conductive state of these layers, they must be cooled below their critical temperature $T_c$ and that requires significant expenditure.

In the electrically conductive field, strip conductors are known which are comprised of a strip carrier of an electrically conductive material and an HTSC film deposited thereon.

In the measurement field, SQUIDs (SQUID: superconductive quantum interference device) are known for high sensitivity measurements of magnetic fields. With HTSC SQUIDs, it is a drawback that the measurement sensitivity is limited by a relative high low frequency noise.

OBJECTS OF THE INVENTION

The invention has as its object the provision of an assembly which can be utilized in various ways and in various fields.

A more specific object of the invention is to provide an arrangement which enables HF components to be obtained with significantly improved component characteristics and the production of superconductive strip conductors with higher current capacities and active superconducting electronic components with a low noise level.

SUMMARY OF THE INVENTION

This object is achieved, according to the invention, by providing a high temperature superconductor film on a carrier and forming the superconductor film with a multiplicity of holes with radii in the range of 50 to 2000 mm.

The invention is based upon the recognition that this can be achieved with an HTSC film with a multiplicity of holes retaining superconducting character and that this can be used technologically in a new way.

The arrangement of the invention has a number of electrical characteristics which can be used with advantage especially in the HF field, in the field of superconducting strip conductors and in the measurement field. By contrast with a known HTSC film without holes, the "Perforated" HTSC film according to the invention has a reduced HF surface resistance, an increased critical current amplitude for direct current and suppression of the noise in active superconductive components resulting from the tendency toward flux tube migration.

Holes in the aforementioned size range can be produced by known lithographic techniques, for example, photolithography, electrobeam lithography or x-ray lithography in combination with known etching processes. Preferably the radius of the holes is in the range of 500 to 1000 nm since holes in this size range can be produced in an especially simple way by photolithographic techniques.

The mean distance d between neighboring holes, the hole r and the thickness t of the film can be so selected as to preferably satisfy the inequality $B_{C1} (t/(d-2r))^{0.5} \geq B$, whereby $B_{C1}$ is the lower critical field of the superconductor and B is the external magnetic field. In this case, all of the flux tubes which arise from the film are anchored (pinned) at respective holes and the previously indicated advantageous characteristics (reduction of the HF surface resistance, increase of the current carrying-capacity and reduction in the noise) can be achieved with the arrangement of the invention in an especially significant way.

According to an especially preferred embodiment of the invention, the density (number per unit area) of the holes can vary from place to place over the film. This enables, for example, in regions of high external magnetic field strengths, increased temperatures or also increased current densities, an especially higher local density of holes in such challenged regions, whereby especially high HF tolerance, current carrying capacity or noise suppression can be obtained.

A further preferred embodiment of the arrangement according to the invention is characterized in that the holes are arranged in a uniform pattern, especially in the form of a hexagonal or square grid across the film. Such an arrangement of the holes is preferred since the Abrikosov grid formed from the free flux tubes has its low energy states in a hexagonal or square structure.

The arrangement according to the invention can be used in many technological fields. An advantageous field of use is in the HF field for resonators and HF conductor components for coaxial and hollow conductor (waveguide) technologies and for integrated (hybrid or monolithic) microwave circuits, for superconductor strip conductors and in the field of noise suppression with active superconductive electronic components.

A first preferred embodiment of the invention can be realized as an HF component which encompasses a hollow chamber resonator in whose interior the arrangement of the invention is provided along the walls. Hollow chamber resonators are used in microwave technology for a variety of components. In communications technology, they serve, for example, as transmitters or filters in television, radio, beacon or direction finding or mobile wireless systems. They can be used in the fields of satellite navigation and radar and serve as particle accelerators in synchrotons. Upon the integration of the arrangement of the invention in a hollow space resonator, the Q-factor of the hollow space resonator is increased. In the interior of the hollow space resonator, a dielectric medium with a dielectric constant $\in >1$ can be provided. In this case, it is preferred to provide the system of the invention adjacent to the dielectric medium.

The hollow space resonator can preferably be configured as a multicavity device. In that case, the resonator can be used as a filter with improved filtering characteristics (steeper flanks) and can produce a greater band width.

A further embodiment of the invention in the HF field is characterized by providing the assembly according to the invention on an interior wall of a hollow conductor (waveguide). In this manner, a hollow conductor with reduced damping can be realized and the transmission and termination characteristics of filters, HF couplers, HF transformers, HF terminating resisters or the like can be improved.

Integrated microwave circuits (MIC) are known in the art in the form of hybrid or monolithic circuits. In hybrid integrated circuits, individual finished components (hybrid elements) are combined to a circuit, while with monolithic integrated circuits, the entire circuit is contained on a semiconductor substrate.

The HF arrangement according to the invention can preferably be used both in the field of hybrid microwave circuits and also in the field of monolithic microwave circuits. In the first case a preferred embodiment of the invention is characterized in that the carrier is formed as a component carrier and the film is structured in the characteristic shape of the HF component. In the second case, the carrier is formed as a semiconductor substrate on which an integrated circuit is formed. In both cases, the microwave capacity of the integrated circuit is increased by the provision by the film according to the invention.

According to a second preferred embodiment of the invention, the assembly of the invention is realized by providing the carrier in the form of an electrically conductive strip conductor forming an electrical conductor. This electrical conductor can be used for low loss transmission of currents or also as a current limiter (superconductor fault current limiter).

Preferably multiple layers of the film coated strip conductor carrier can be assembled to a multifilament conductor. In addition, the conductor can be configured in the form of a coil.

A third preferred embodiment of the invention can be realized by surrounding the active electronic component with the system of the invention so that the electronic component has an active component region subject to flux noise, the assembly according to the invention being provided either directly around the active component region or by forming the active component region directly in the film.

With the hole arrangement according to the invention, strong active forces ("pinning forces") are produced in the region of the active zone and are effective to anchor the flux tubes at the holes. By such anchoring, a thermally excited flux meandering or "vortex hopping" is suppressed and, in this manner, the noise of the active electronic component is reduced.

An advantageous configuration of the active electronic component is characterized in that the film is in the form of a ring surrounding an inner free region and containing a Josephson contact. A superconductive ring with at least one Josephson tunnel contact is known in the field as a SQUID. The low frequency noise of a SQUID is mainly determined by fluctuations of the number of elemental flux quanta traversing the superconductive ring. To keep these fluctuations small, the free region formed by the ring is preferably surrounded on all sides by the holes.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
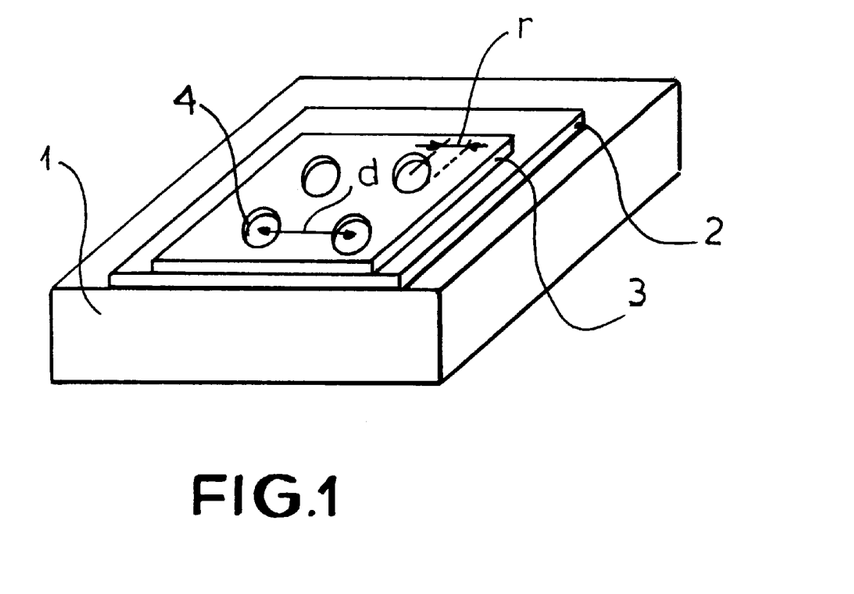
FIG. 1 is a schematic perspective view of an assembly according to the invention.

FIG. 1 is a schematic illustration of an assembly according to the invention. This comprises a carrier 1 which can be constituted for example of sapphire, $LaAlO_3$, MgO or $SrTiO_3$ and which is thermally coupled to a cooling unit in a manner not shown. On the surface of the carrier 1, there is here provided a buffer layer 2, for example, of $CeO_2$, of a thickness of about 100 nm. The optional buffer layer 2 serves as a planar (even) base layer for a superconductor film 3 applied thereover and constituted from $YBa_2Cu_3O_7$ (YBCO), whose thickness t, for example, amounts to 100 nm.

The YBCO-film is provided with throughgoing holes 4 of circular disk-shaped cross section ("antidots"), which can be produced, for example, by photolithography or an electronic beam lithographic process in the film. The hole radius and the (average) distance d between two neighboring holes can be varied over a wide range and can amount, in the illustrated example, to R=1 µm and d=10 µm.

The transition temperature $T_c$ of such a YBCO-film provided with holes 4 lies above 77K so that liquid nitrogen can be used as the cooling medium.

Figure 2A:
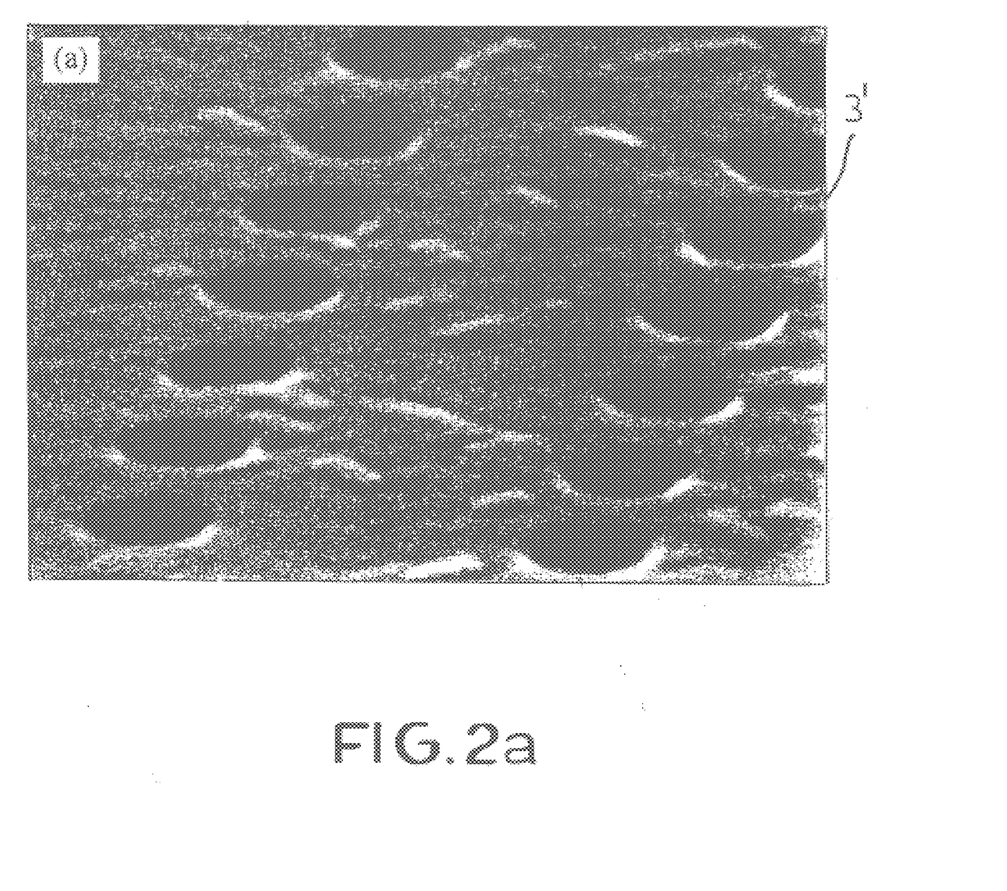
FIG. 2*a* is a scanning electron microscope image of the arrangement of FIG. 1.

FIG. 2a shows an image of a YBCO-Film 3' obtained with a scanning electron beam microscope. The YBCO-Film 3' is applied by a high pressure magnatron sputtering process as a thin film on the buffer layer 2 and has a very low surface roughness of less than 4 nm (from peak to peak). The hole radius amounts to r=0.12 µm and the distance d between neighboring holes amounts, depending upon the orientation, either to 0.5 µm or to 1.0 µm.

The structuring is obtained by covering the YBCO-Film 3' with an Au/Nb/PMMA three-layer photoresist. The hole structure is transferred to the YBCO film 3' by means of electron beam lithography and a reactive etching step using $SF_6$ through the photoresist mask followed by an Ar-ion dry etching step.

Figure 2B:
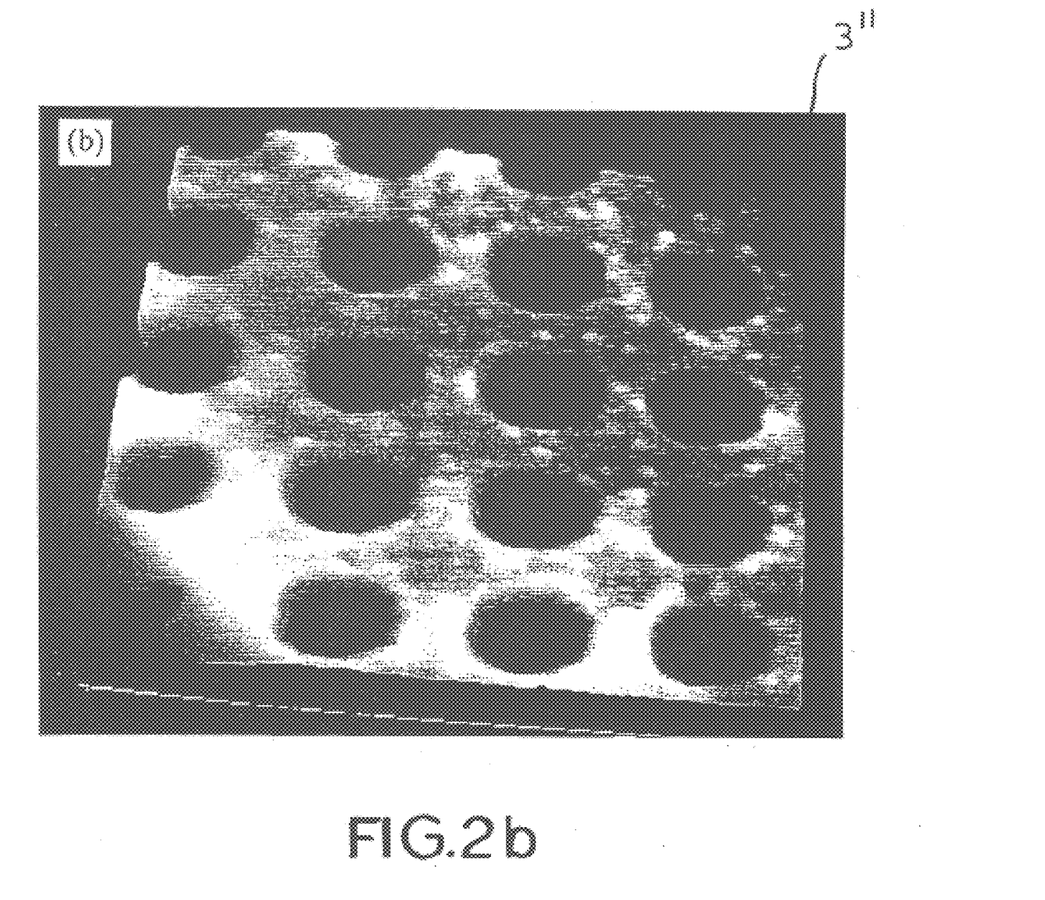
FIG. 2*b* is an image taken with a power scanning microscope of a further arrangement according to FIG. 1.

FIG. 2b shows a further YBCO-Film 3" in a scanning power microscope image. The YBCO-Film 3" has a square hole pattern where r=0.12 µm and d=1.0 µm. The structuring is also effected by an electron beam lithographic process.

Figure 3:
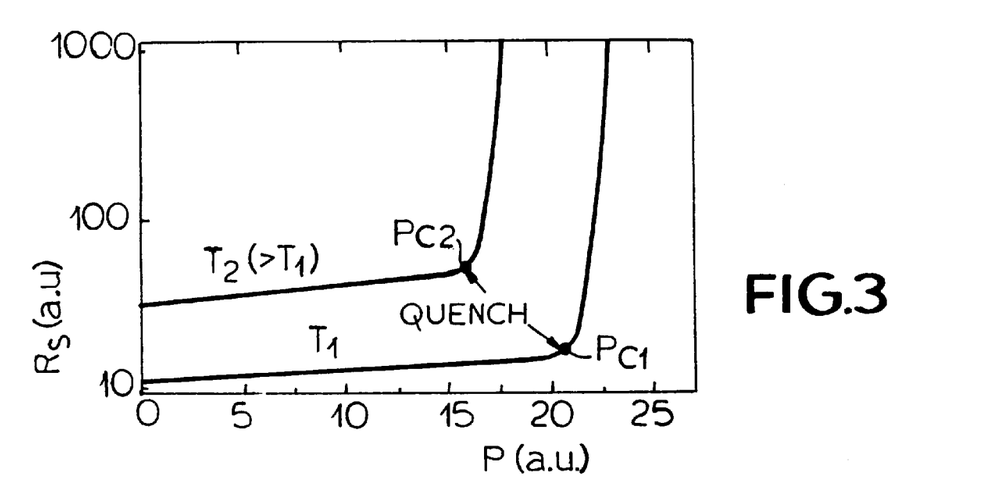
FIG. 3 is a diagram that schematically shows the power dependency of the microwave surface resistance of a superconductor in a microwave field at two different cooling temperatures $T_1$ and $T_2$.

FIG. 3 serves to clarify the concept of the HF tolerance of a superconductor in an HF field which is generated by a transmitter with an HF power P. The curve of the HF surface resistance $R_s$ is shown for two different cooling temperatures $T_1$ and $T_2$. The illustrated curve is characteristic in general for superconductors.

FIG. 3 shows that the HF surface resistance Rs increases slowly with the applied HF power to a characteristic power $P_{C1}$ or $P_{C2}$ and above the characteristic power $P_{C1}$ or $P_{C2}$, has a jump upwards.

The jump like increase in the HF surface resistance $R_s$ has its origins in the sudden increase in the temperature of the superconductor at its transition to the normal conductive state. At the characteristic power $P_{C1}$ or $P_{C2}$, the superconductivity is broken because of the excessive heating suddenly (a so-called quench). FIG. 3 shows that the superconductor at a lower cooling temperature $T_1$ has a higher characteristic power $P_{C1}$ and thus a higher HF tolerance than at a higher cooling temperature $T_2$ at which the transition has already occurred at a characteristic power $P_{C2}$.

In practice, the temperature T of a superconductive film in an HF field represents a competition between the HF power dissipated in the film (corresponding to the supplied heat) and the cooling efficiency (determining the heat removed). A reduction in the HF surface resistance $R_s$ gives rise to a reduction of the temperature of the superconductive field and thus an increase in the HF power tolerance. It is also of considerable significance that the HTSC thin film 3, 3', 3" according to the invention has a clearly smaller HF surface resistance $R_s$ than an HTSC thin film of corresponding dimensioning without holes. According to FIG. 3, its HF power tolerance is higher than that of a corresponding HTSC thin film without holes. It does, however, remain superconductive even at higher HF powers P, i.e. and thus is available for use at such higher powers.

Below there is provided a possible theoretical explanation for the reduction in the HF surface resistance $R_s$ of the arrangement according to the invention.

Initially, the physical origin of the dissipation of HF field energy is considered for a conventional HTSC thin film without holes:

Dissipation in a conventional HTSC thin film can have two different origins. In one case, local surface inhomogeneities (defects, normally conducting inclusions, mechanical damage or the like) can be the reason for dissipation in an HTSC thin film. Such surface inhomogeneities are associated with a substantially higher HF surface resistance $R_s$ than is the case with an undistorted film. The power dissipated in the film is proportional to the square of the magnetic field strength of the HF alternating field at the locality of the surface inhomogeneities and gives rise with increasing HF power to a local heating (hot spot) not only at the surface inhomogeneities, but also of the neighboring undeformed (superconductive) film surface so that there the HF resistance $R_s$ is increased because of its temperature dependency, i.e. the dissipation is further increased.

In the other case, magnetic flux tubes (also known as vortices) contribute to the dissipation in the HTSC thin film 3, 3', 3". Upon exceeding the so-called penetration field $B_p$ (which depends upon the lower critical field $B_{C1}$ of the HTSC type II superconductor and its geometry) such flux tubes can penetrate into the superconductive film (the so-called Shubkinov Phase of the superconductor). Each flux tube or vortex has a normally conducting core and carries an elemental magnetic flux quantum $\phi_o$, whereby $\phi_o \approx 2 \cdot 10^{-15}$ Vs. The dissipation by way of flux tubes also arises through two mechanisms. The first is based upon a movement of the flux tube in the superconductor (flux tube migration) and the other is based upon HF currents which are generated in the external HF alternating field in the normally conducting core of the flux tube.

Initially, in the context of the invention, the incorporation of the holes 4 in the HTSC thin film 3, 3', 3" apparently does not act to increase the film inhomogeneities which cause an increase in the HF surface resistance. Furthermore, both of the latter flux tube dissipation effects are positively affected by the holes 4. On the one hand, the holes 4 form anchoring centers for the flux tubes (pinning centers) which suppress effectively the flux tube migration in the HF field. On the other hand, unlike the case with conventional flux tubes, the flux tubes pinned at the holes 4 apparently do not have normally conducting cores. The HTSC thin films 3, 3', 3" according to the invention with holes, even at magnetic field strengths above the penetration field strength of a conventional HTSC thin film, do not have dissipation contributions from the flux tubes pinned at the holes.

Figure 4A:
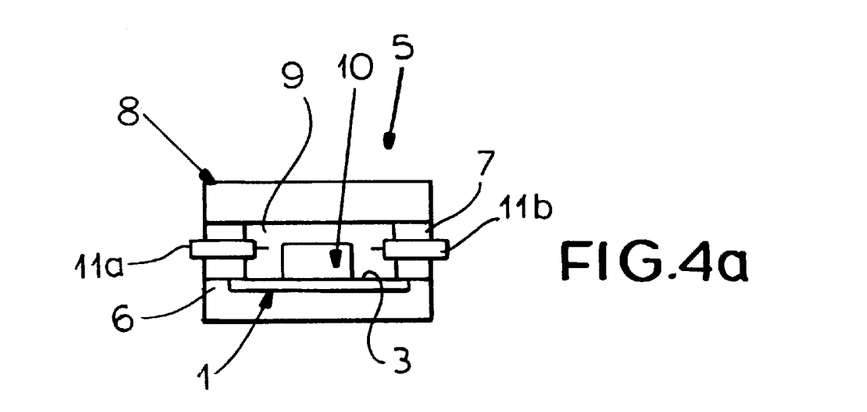
FIG. 4*a* is a schematic cross sectional view of a resonator containing the arrangement of the invention according to a first embodiment of the invention.

FIG. 4 shows a resonator 5 in a cylindrical configuration with a resonance frequency of the $TM_{011}$ wave in the GHz range. The resonator 5 has a circular disk shaped bottom plate 6, a cylindrical peripheral wall 7 and a resonator cover 8. The resonator wall elements 6, 7, 8 are comprised of a metal for good electrical conductivity, like for example, copper and define a hollow space 9. On the surface of the bottom plate 6 is an arrangement according to the present invention comprised of a carrier 1, an optional buffer layer and a YBCO-Film 3. A cylinder 10 comprised of a dielectric material with a higher dielectric constant ∈ (for example, of sapphire or barium titanite in zirconate) is centrally located in the hollow space 9. An in-coupling antenna 11a and an out-coupling antenna 11b extend through the cylindrical peripheral wall 7 into the hollow chamber 9.

Upon excitation of the resonator 5 by coupling of HF power into it through the in-coupling antenna 11a, a resonance field is formed in the hollow space 9 in the form of a standing electromagnetic wave. A major part of the field energy is thus stored in the dielectric cylinder 10.

The losses of the resonator 5 are comprised of the dielectric losses in the dielectric cylinder 10 and the dissipative wall current losses in the resonator walls. Since the highest microwave power is provided directly surrounding the dielectric cylinder 10, the losses in the region of the plate 6 directly adjoining from the dielectric cylinder 10 are critical. The effect of the system of the invention 1, 2, 3 provided between the bottom plate and the dielectric cylinder is thus that the bottom plate 6 is shielded from the microwave field and thereby because of the greatly reduced HF surface resistance RS by comparison to Cu, the wall current losses are significantly reduced. As a result, the Q-factor of the resonator (defined as the product of the resonance frequency $\omega_R$ with the quotient of the field energy stored in the resonator and power loss) can be increased. This is especially advantageous with high resonance frequency $\omega_R$ since the quality factor of the hollow chamber resonator decreases toward high frequencies with the reduction of the unit size proportionally to $\omega_R^{-0.5}$.

Figure 4B:
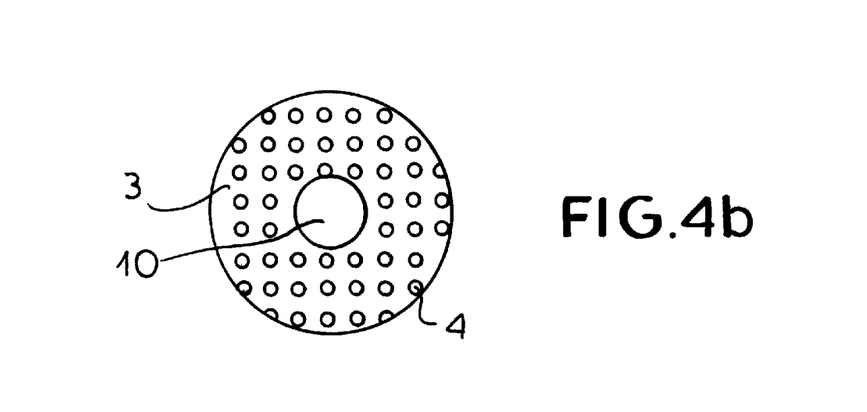
FIG. 4*b* is a plan view of the resonator shown in FIG. 4*a* with the resonator cover removed.

FIG. 4b shows the inner space 9 of the resonator 5 with the resonator cover 8 removed and without the in-coupling and out-coupling antenna 11a, 11b in a plan view. The holes 4 of the YBCO-thin film 3 on the carrier 1 which is not visible, are here arranged in a square pattern with constant distances d between the holes 4. In a manner not shown, however, a greater hole density can be provided in the region of the dielectric cylinder 10. In this fashion, the HF tolerance of the YBCO-thin film in the region of the dielectric cylinder 10 can be so increased that the resonator 5 as a whole can be driven with a higher power P.

The arrangement of the invention can be used in all known hollow space resonator types (with cylindrical, cubic and like spaces, with and without dielectrics) whereby the resonator walls, depending upon the specific application and the basic resonator geometry can be provided over either part of their areas or over their entire areas with the arrangement according to the invention.

The arrangement according to the invention can also be integrated in coaxial waveguides or hollow waveguides. Several such embodiments are shown in FIGS. 5a, 5b and 5c.

Figure 5A:
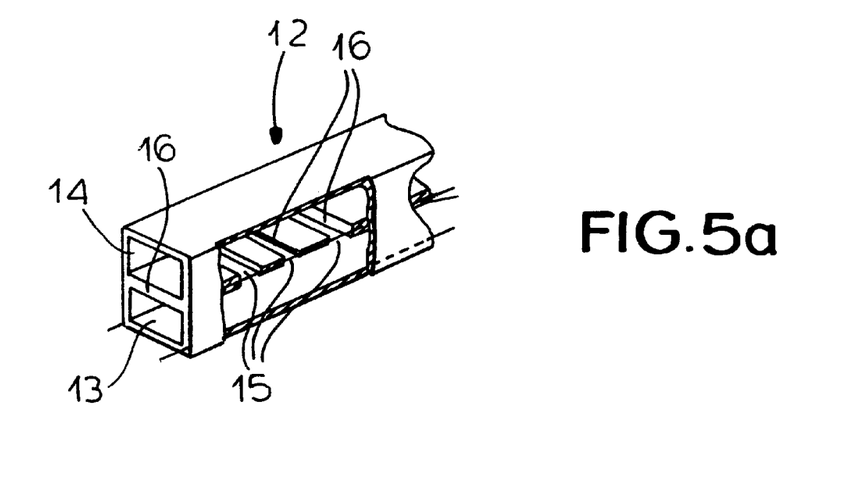
FIGS. 5*a*, 5*b* and 5*c* are perspective views of further HF components of the hollow wave guide type containing in their interiors assemblies according to the invention, FIG. 5*a* being broken away.

FIG. 5a shows a wide slit coupler 12 which embraces two parallel hollow guides 13, 14 which are connected together via connecting slits 15 in a common partition 16. By appropriate dimensioning of the connecting slits 15, the coupling characteristics can be determined as desired. The arrangement according to the invention can be applied over part or entire areas of the inner walls, especially the partition 16 of the hollow guides 13, 14 so that especially those wall regions which are impacted by the higher HF power will be covered with the arrangement according to the invention.

Figure 5B:
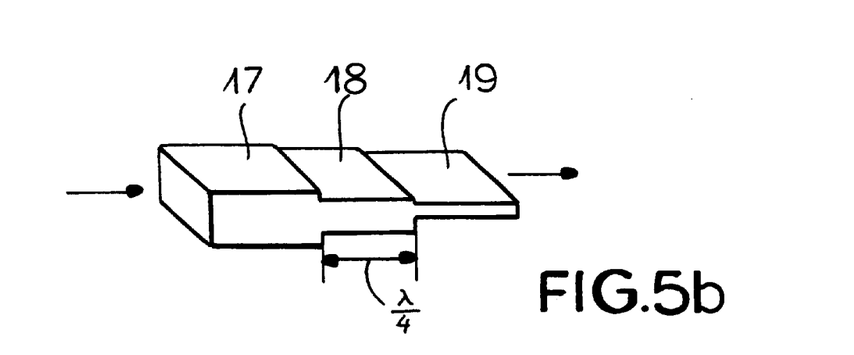

FIG. 5b is a perspective illustration of a λ/4 waveguide which can also be considered to be a λ/4 transformer. It is comprised of three successive hollow space segments 17, 18, 19, each with a length of λ/4. The λ/4 waveguide is provided as a transition waveguide for matching two HF waveguides which have not been shown, with different waveguide resistances. The system according to the invention is provided along the interior (not shown) of the λ/4 waveguide especially on those wall surfaces which are impacted by the greater HF power.

Figure 5C:
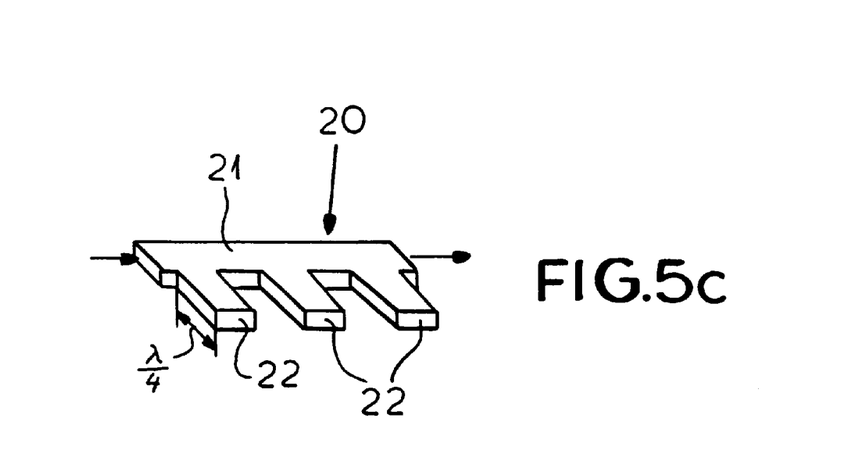

FIG. 5c shows a three-pole HF chamber filter 20 comprised of a main waveguide 21 to which three lateral chamber projections 22 of the length λ/4 are connected. The arrangement of the invention can be provided on the walls of the chamber projections 22 and again especially at locations of high HF power.

Further fields of use of the system of the invention can be found in the technology of hybrid or monolithic integrated microwave circuits MIC (MIC=microwave integrated circuit). The MICs are usually fabricated in a thin film planar technology and are thus especially suitable for application of the present invention.

Figure 6:
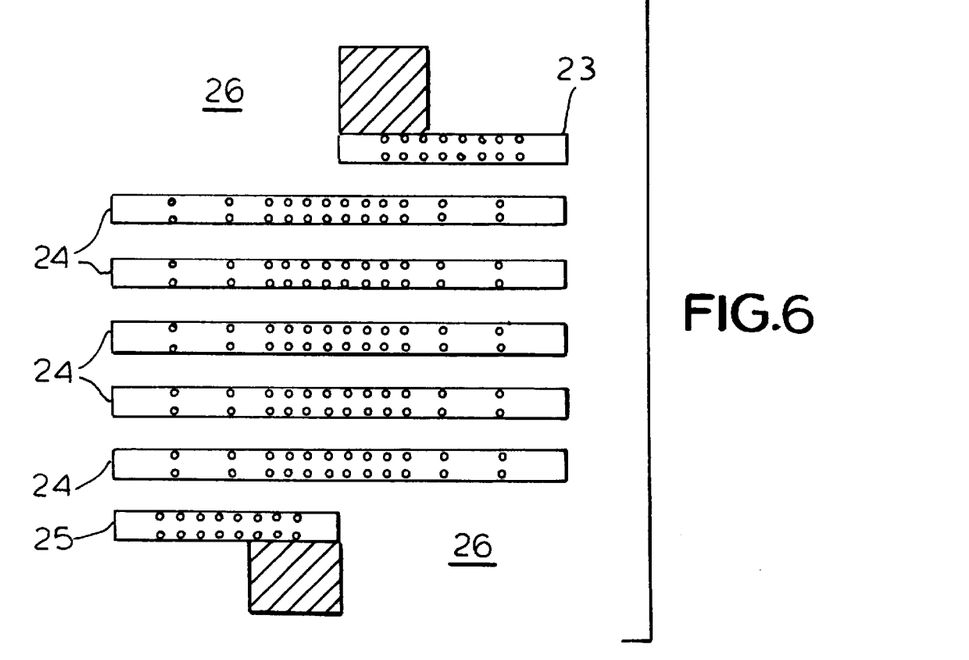
FIG. 6 is a schematic illustration of an HF bandpass filter in plan view.

FIG. 6 shows an example of an HF hybrid component in the form of a 5-pole bandpass filter. The bandpass filter comprises a carrier 26 of a dielectric material with good thermal conductive characteristics, for example, sapphire, an optional $CeO_2$ buffer layer (not shown) corresponding to that illustrated in the FIG. 1 and a YBCO thin film. By contrast with the system illustrated in FIG. 1, the YBCO-thin film here is structured in a strip pattern determined by the component characteristics. The strip pattern encompasses a λ/4 input strip 23, five λ/2 strips 24 and a λ/4 output strip 25, all of which are arranged parallel to one another. The HF power is supplied at the input strip 23 and is transferred via the parallel-connected strips 24 to the output strip 25. With a further increase in the number of strips 24, the filter characteristic can be improved.

FIG. 6 graphically shows that the hole density on the longitudinal edge regions of the individual strips 23, 24 and 25 and in the region of the middle of the strips, is locally increased. This is the basis for a current increase as a result of the strip geometry at the longitudinal edge regions of the strip and the oscillation maxima which occurs with resonance at the middles of the strip under an HF field. Because of the increase in the hole density in such regions, there is greater HF loading and a greater HF capacity of the component.

Further hybrid strip conductor structures as, for example, resistors, capacitors, inductors as well as strip conductor coupling elements and strip conductor resonators, can be realized in corresponding ways with use of the system according to the invention. With these components as well, the hole density can be increased in critical regions of higher HF loading depending upon the shape or resonance characteristics.

Furthermore, even monolithic MICs can be realized in a corresponding construction technique. As carriers in such cases, a semiconductive substrate is used, whereby YBCO-thin films are applied which can be structured and formed with holes in suitable ways, for example by sputtering and optionally with use of an insulating layer between the semiconductor substrate and the YBCO-thin films, the insulating layer being applied to the semiconductor substrate.

The arrangements according to the invention can also be used outside the high frequency field.

Figure 7:
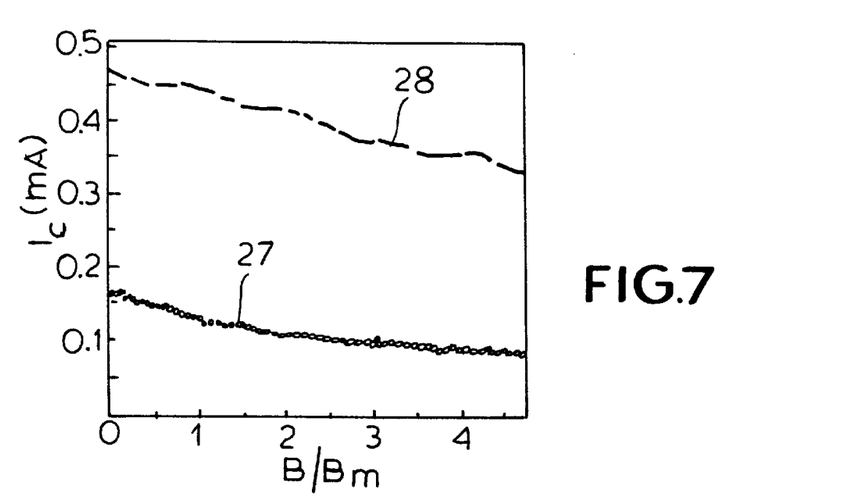
FIG. 7, is a diagram showing the critical current amplitude of a YBCO-thin film arrangement according to the invention with holes and a correspondingly dimensioned YBCO-thin film arrangement without holes as a function of the magnetic field B referred to $B_m$.

FIG. 7 shows a diagram in which the critical current amplitude IC for direct current is plotted as a function of the magnetic field strength B relative to $B_m$, whereby $B_m = \phi_0/d^2$ is the field strength which corresponds to a flux tube density of one flux tube per grid hole. The measuring points 27 give the critical direct current amplitude $I_C$ of a YBCO-thin film without holes whereas the measuring points 28 give the critical DC current amplitude $I_C$ of an identically prepared YBCO thin film but which has been provided with holes (hole distance d) in the manner of the invention. From FIG. 7, it can be seen that the critical dc current amplitude $I_C$ of the YBCO film provided with holes is greater by a factor of approximately 3 than that of the corresponding YBCO film without holes. It should also be noted that the YBCO-thin film provided with holes, as a result of the material loss resulting from provision of the holes, has a clearly smaller cross section for the current flow than the YBCO thin film without holes.

It can be assumed that the increased critical current amplitude $I_C$ for direct current of the YBCO thin film provided with holes, is based upon the suppression of the flux tube migration by the pinning of the flux tubes at the holes.

Figure 8:
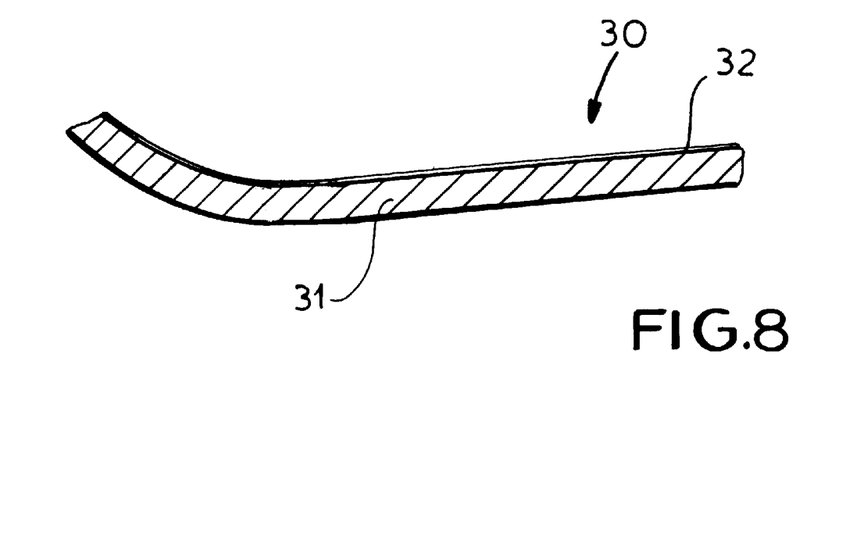
FIG. 8 is a schematic side elevational view of an inventive electrical strip conductor according to a second embodiment of the invention.

FIG. 8 shows an embodiment of an electrical strip conductor 30 in accordance with the invention. The strip conductor 30 has a strip conductor carrier 31 in the form of a metal strip 31. The metal strip 31 is comprised for example from Hastalloy and is provided with a polished surface with high surface planarity. The polished surface of the metal strip 31 is coated with a biaxial buffer layer not here shown and which is formed for example from Y-stablized $ZrO_2$ (so-called YSZ). For the coating, an IBED (Ion Beam Assisted Deposition) process is used in which during the coating the YSZ buffer layer to be formed is fired with ions at a defined angle onto the substrate so that a texture is formed in the coating plane. Then epitactic YBCO layers are deposited upon the YSZ buffer layer in the form of a film 31 which can be provided in the aforedescribed way with a hole pattern. The strip conductor 30 has basically the structure illustrated in FIG. 1. In this manner, the YBCO film 32 has similar good characteristics to a YBCO film deposited upon a monocrystalline carrier (for example sapphire, $LaAlO_3$, MgO, $SrTiO_3$).

A further possibility for producing the strip conductor 30 according to the invention is the fabrication of the strip conductor carrier 31 by a rolling or drawing process from a metallic material (for example Ag) and the formation of the YBCO film 32 as a result of an immersion process in an organometallic solution and a subsequent pyrolytic step.

The strip conductor 30 according to the invention operates in the following manner:

If a current is passed through the strip conductor 30, the (superconductor) YBCO film 32 and the strip conductor carrier 31 form parallel current conducting paths. Since the electrical resistance of the superconducting YBCO film 32 is substantially less than that of the strip conductor carrier 31, the current flow is close to exclusively through the superconductive film 32. Thus the strip conductor 30 according to the invention, because of the increase in the critical current amplitude $I_C$ illustrated in FIG. 7, will have a significantly higher current transport than a comparably constructed superconductive YBCO film strip conductor carrier without holes in the YBCO film.

The strip conductor 30 illustrated in FIG. 8 can also be provided as a current limiter. Upon exceeding of the critical current amplitude $I_C$ and the interruption in superconductivity associated therewith in the YBCO film 32, the current flowing through the strip conductor is reduced to a value which is determined by the ohmic resistance of the strip conductor carrier 31 which can be adjusted or selected by a corresponding dimensioning and/or material selection of the latter.

Figure 9:
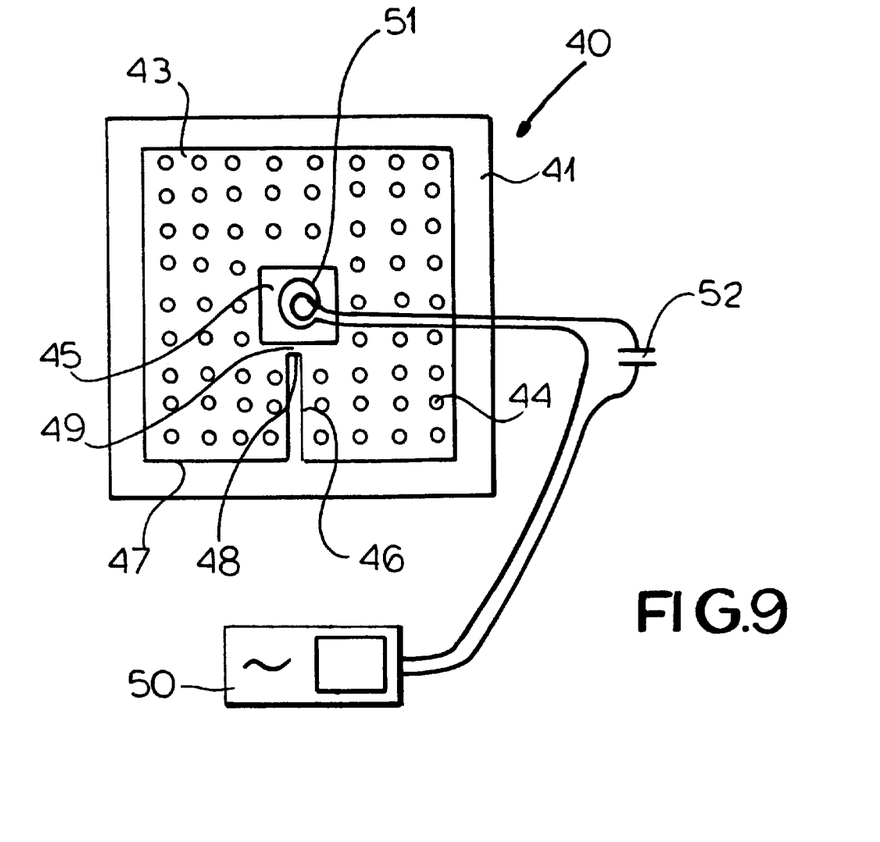
FIG. 9 is a schematic illustration of an RF-HTSC SQUID in plan view with control and evaluation electronics connected thereto according to a third embodiment of the invention.

A third embodiment of the invention is shown in FIG. 9.

FIG. 9 shows an RF HTSC (HTSC=High temperature superconductor)—SQUID 40 which, via an appropriate structuring of the YBCO thin film 3, can be fabricated in the arrangement shown in FIG. 1.

The RF SQUID 40 comprises, for example, a carrier of sapphire, $LaAlO_3$, MgO or $SrTiO_3$ onto which in the previously described manner, optionally through use of a $CeO_2$ buffer layer, a YBCO thin film 43 is applied. In the central region of the thin film, a square free space 45 is formed which gives the YBCO thin film 43 the configuration of a ring. In addition, in the YBCO thin film 43 there is a rib-like cutout 46 which extends from one edge 47 of the YBCO thin film 43 in the direction of the central free space 45 and ends before it reaches the free space 45.

Between the lateral ends 48 of the recess or cutout 46 at the free space side and the free space 45, there is a bridge which forms a Josephson tunnel contact 49 of the YBCO thin film. The Josephson tunnel contact 49 can be obtained in a number of ways. For example, it can be formed in the course of a step formation of the carrier 41 or in the form of a thinner region of the thin film 43.

The YBCO thin film 43 is provided with holes in the already described manner and which, in the illustrated embodiment, can be arranged in a square grid and can surround the free space 45 on all sides.

A DC HTSC SQUID also encompassed by the invention and which has not been illustrated, differs from the illustrated RF HTSC SQUID 40 substantially only in that instead of a single Josephson tunnel contact 49, two such contacts are formed in the ring.

In a not illustrated alternative embodiment of a SQUID, the superconductive ring with a Josephson contact or with Josephson contacts is not formed with a structure in a film 3 according to the system of the invention, but rather is of conventional planar construction on a separate chip. The noise suppression is then achieved in that an arrangement 1, 2, 3 according to the invention as in FIG. 1 in a simple "flip-chip" configuration, i.e. with the film 3 provided with the holes 4 inverted, is placed upon the SQUID carrying chip and fixed thereon. Then the Josephson contact (or Josephson contacts) need not necessarily be covered by the device of the invention. It is only important that the YBCO film 3 provided with holes be placed upon the ring of the SQUID such that a fluctuating penetration of flux tubes into the ring interior is hindered.

To drive the RD-HTSC SQUID 40, it is coupled via a coil 51 inductively to a control and evaluating circuit 50. In the feed line to the coil 51 there is provide a capacitance 52. The coil 51 and the capacitance 52 form an oscillation circuit which is driven with RF alternating current in the range of for example 100 to 800 MHz. The control and evaluating circuit has a frequency measuring unit which provides a frequency match to the oscillating circuit 51, 52.

The operation of the RF-HTSC SQUID 40 is based upon the following principle:

Because of the flux quantization, the magnetic flux in the superconductive ring (free space 45) always corresponds to a multiple of the elemental flux quanta $\phi_o$. If the external magnetic field B is varied, a shielding current is induced in the ring which has the effect of leaving the magnetic flux in the ring unchanged. Because of the presence of the Josephson contact 49, the shielding current cannot exceed a certain maximum value. When the shielding current reaches the maximum value determined by the Josephson contact 49, the magnetic flux traversing the ring switches to another multiple of $\phi_o$. By a corresponding dimensioning of the Josephson contact 49, the magnitude of the maximum shielding current can be so set that changes of one $\phi_o$ can be detected.

With the oscillating circuit 51, 52 connected to the RF-HTSC SQUID 40, the magnetic flux can continuously oscillate about one $\phi_o$. This enables changes in the external magnetic flux of a fraction of $\phi_o$ to be detected. With the aid of the control and evaluating circuit, an additional compensating current can be fed to the ring which enables external flux variation to be continuously compensated so that the device can operate in a "flux-locked-loop mode".

Figure 10:
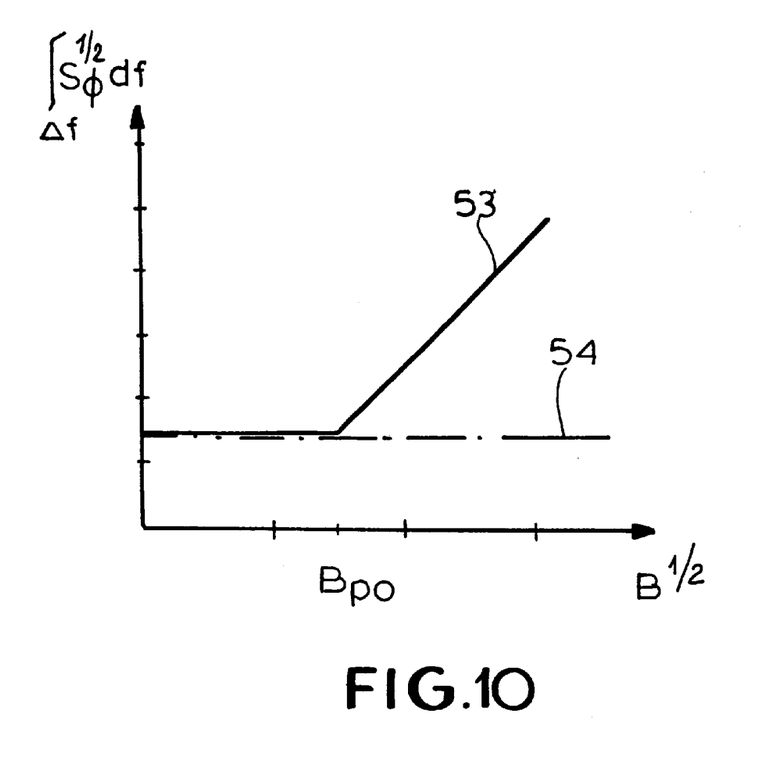
FIG. 10 is a diagram which shows in a schematic manner the low frequency noise of a conventional HTSC SQUID without holes and an HTSC SQUID without holes according to the invention as a function of an external magnetic field.

FIG. 10 shows in a qualitative form the lower frequency noise characteristics (total noise in the range of for example 1 to 10 Hz) of a conventional HTSC SQUID without holes (curve 53) and that of an HTSC SQUID according to the invention with holes (curve 54) as a function of the external magnetic field B.

With an external magnetic field B below the penetration field strength $B_{po}$ of the HTSC thin film without holes (for example $B_{po}$=5 $\mu$T), the two curves 53 and 54 run identically; the lower frequency noise is small.

When the outer magnetic field B exceeds the penetration field strength $B_{po}$ of the HTSC thin film without holes, the noise $S^{0.5}$ rises with the conventional SQUID proportionally to $B^{0.5}$. By contrast, the noise with the HTSC SQUID 40 of the invention remains at a low level even where B is >$B_{po}$ (see curve 54).

This has its origins in the following:

Upon reaching the penetration field strength $B_{po}$, the magnetic flux tubes in the case of a conventional HTSC thin film without holes penetrate into the HTSC thin film. The flux tubes collect at lattice defect locations or at other centers in the HTSC thin film. The corresponding binding energies are however so low that at the prevailing temperature of 77K and higher, the flux tubes are subject to a thermally excited movement ("vortex hopping") in the HTSC thin film. This is characteristic of fluctuations in the magnetic flux traversing the ring and the consequent development of noise.

As has already been indicated, the holes 44 of the thin film 43 according to the invention form artificial anchoring centers for flux tubes which have substantially higher attractive potentials for the flux tubes than the "natural" adhesion centers. As a consequence, the nonanchored flux tubes in regions between the holes are formed at a magnetic field strength $B_p$ (penetration field strength of the thin film 43 provided with the holes 44) which is greater than the penetration field strength $B_{po}$ of the film not provided with holes.

$B_p$ is dependent upon the hole radius r, the hole spacing d and the thickness t of the thin film and is determined by the equation $B_p=B_{c1}(t/(d-2r))^{0.5}$.

Since the flux tubes pinned at the holes do not contribute to the noise of the SQUID 40, flux noise arises only upon attainment of the penetration field $B_p$. The measurement of the noise reduction depends inter alia upon the maximum number n of flux tubes which can be pinned at the holes 44. Since the max number n is just that which is realized at the onset of penetration of flux tubes between the region of holes 44 (i.e. at B=$B_p$), it follows that n=$B_{c1}(d^2/\phi_o) \cdot (t/(d-2r))^{0.5}$.

A further noise reduction effect is achieved since even flux tubes that are not pinned at holes (as can arise where B>$B_p$) and which would contribute noise in the case of a YBCO film without holes, can be pinned at "between-hole locations" of the hole grid and thereby limited in their mobility.

Furthermore, by arranging the holes 44 in a square or hexagonal hole pattern, the degree with which the flux tubes can be anchored in the HTSC thin film 43 can be further increased because the local distributions of the anchoring centers (holes) can already correspond to the two energetically preferred states of unbound flux tubes.

The noise suppression in the case of an RF HTSC SQUID 40 already described can be used also for other active superconductive electronic components in which flux noise arises.

For example, SFQ (Single Flux Quantum) logic circuits or RSFQ (Rapid Single Flux Quantum) logic circuits are known and substantially comprise a multiplicity of Josephson tunnel contacts with the basic switch elements in logic circuits and connected via electrical conductors in suitable ways with one another. Upon construction, these SFQ or RSFQ logic circuits are similar to conventional microelectronic logic circuits and can be realized in a chip construction.

Figure 11:
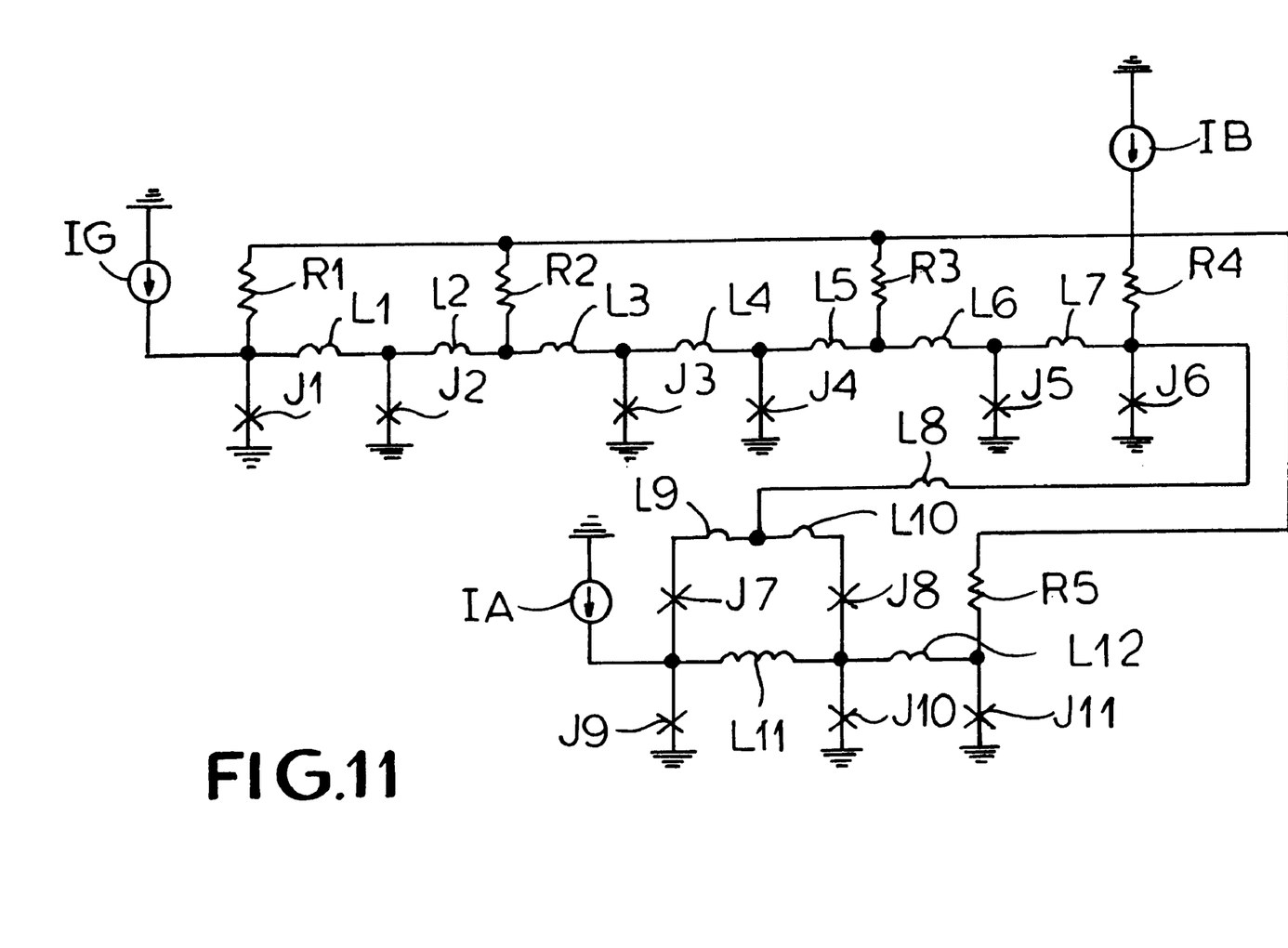
FIG. 11 is a circuit diagram of a RSFQ switching circuit.

FIG. 11 shows a circuit diagram of one such known type of RSFQ logic circuit. The Josephson tunnel contacts are designated by J1, J2, ..., J11, the electrical resistances by R1, R2, ..., Rs, and the impedances by L1, L2, ..., L12. IG, IB and IA indicate signal lines on which the logic signals lie.

A problem of such logic circuits with Josephson tunnel contacts have been, aside from the reproducible manufacture of the tunnel contacts, especially the suppression of perterburations by captured magnetical fluxes in the form of individual flux quanta. These flux quanta give rise to flux jumps (flux fluctuations) with a sharp increase in the error rate of such circuits.

With a logic circuit according to the invention, constructed for example according to FIG. 1, an HTSC film provided with holes (see FIG. 1) is arranged in the regions of the Josephson contacts J1, J2, ..., J11 at which noise can develop so as to pin the magnetic fluxes generated in these regions. For example, the Josephson contacts J1, J2, ..., J11 can be formed as in FIG. 9 directly in an HTSC film 43 provided with holes although it is also possible to provide an HTSC film with holes in the previously described flip chip configuration from above on the entire logic circuit or in regions thereof susceptible to noise. In this manner, the error rate of such a logic circuit can be significantly reduced. SFQ logic circuits and RSFQ logic circuits according to the invention have a wide use spectrum and can be employed in simple circuits (for example AD converters), complex circuits (for example digital SQUID components) as well as in highly integrated circuits (for example memory circuits and digital logics).

I claim:

1. A high frequency component comprising a component carrier and a superconductor deposited on said carrier in the form of a high temperature superconductive film provided with a multiplicity of holes penetrating through the film and having a radius in the range of 50 to 2000 nm, said film being structured in a shape characteristic of a high frequency electronic component, a numerical density of said holes varying locally over said film.

2. The high frequency component defined in claim 1 wherein said film has the configuration of a strip.

3. The high frequency component defined in claim 1 wherein said film has the configuration of a ring.

4. The high frequency component defined in claim 3 wherein the mean distance d between neighboring holes, the hole radius r and a thickness t of the film are so selected as to satisfy the inequality $B_{c1} (t/(d-2r))^{0.5} \geq B$ where $B_{c1}$ represents a lower critical field of the superconductor and B is an external magnetic field.

5. The high frequency component defined in claim 4 wherein the hole radius lies in the range of 500 to 1000 nm.

6. The high frequency component defined in claim 5 wherein the mean distance d between neighboring holes is in the range of 2 to 250 μm.

7. The high frequency component defined in claim 6 wherein the mean distance d between neighboring holes lies in the range of 5 to 20 μm.

8. The high frequency component defined in claim 1 wherein the mean distance d between neighboring holes is in the range of 2 to 250 μm.

9. The high frequency component defined in claim 1 wherein the hole radius lies in the range of 500 to 1000 nm.

10. The high frequency component defined in claim 1 wherein the mean distance d between neighboring holes is in the range of 5 to 20 μm.

11. The high frequency component defined in claim 1 wherein the high temperature superconductor film is a $YBa_2Cu_3O_7$ material.

* * * * *